(12) United States Patent
Wang et al.

(10) Patent No.: US 10,707,213 B2
(45) Date of Patent: Jul. 7, 2020

(54) METHOD OF FORMING LAYOUT OF SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chia-Hung Wang, Taichung (TW); En-Chiuan Liou, Tainan (TW); Chien-Hao Chen, Tainan (TW); Sho-Shen Lee, New Taipei (TW); Yi-Ting Chen, Tainan (TW); Jhao-Hao Lee, New Taipei (TW)

(73) Assignees: UNITED MICROELECTRONICS CORP., Hsin-Chu (TW); Fujian Jinhua Integrated Circuit Co., Ltd., Quangzhou, Fujian Province (CN)

( * ) Notice: Subject to any disclaimer, the term of this patent is extended or adjusted under 35 U.S.C. 154(b) by 0 days.

(21) Appl. No.: 16/178,521

(22) Filed: Nov. 1, 2018

(65) Prior Publication Data

US 2020/0111791 A1    Apr. 9, 2020

(30) Foreign Application Priority Data

Oct. 9, 2018    (CN) .......................... 2018 1 1172594

(51) Int. Cl.
*H01L 21/311* (2006.01)
*H01L 27/108* (2006.01)
(Continued)

(52) U.S. Cl.
CPC ...... *H01L 27/1085* (2013.01); *H01L 21/0273* (2013.01); *H01L 21/0337* (2013.01); *H01L 21/31144* (2013.01)

(58) Field of Classification Search
CPC ........... H01L 21/02337; H01L 21/0273; H01L 21/0337; H01L 21/0338; H01L 21/31144;
(Continued)

(56) References Cited

U.S. PATENT DOCUMENTS

2006/0240361 A1* 10/2006 Lee ..................... H01L 21/0337
430/313
2013/0178067 A1* 7/2013 Yu ....................... H01L 21/0337
438/699

(Continued)

*Primary Examiner* — Brook Kebede
(74) *Attorney, Agent, or Firm* — Winston Hsu

(57) ABSTRACT

A method of forming a layout of a semiconductor device includes the following steps. First line patterns extend along a first direction in a first area and a second area, but the first line patterns extend along a second direction in a boundary area. Second line patterns extend along a third direction in the first area and the second area, but the second line patterns extend along a fourth direction in the boundary area, so that minimum distances between overlapping areas of the first line patterns and the second line patterns in the boundary area are larger than minimum distances between overlapping areas of the first line patterns and the second line patterns in the first area and the second area. A trimming process is performed to shade the first line patterns and the second line patterns in the boundary area and the second area.

20 Claims, 12 Drawing Sheets

(51) Int. Cl.
   *H01L 21/027* (2006.01)
   *H01L 21/033* (2006.01)
(58) Field of Classification Search
   CPC ........... H01L 21/76816; H01L 27/1085; H01L
               27/2409; H01L 45/06; H01L 45/1233;
                                       H01L 45/1675
   USPC ....................................................... 438/703
   See application file for complete search history.

(56) References Cited

U.S. PATENT DOCUMENTS

2016/0336193 A1  11/2016  Park
2019/0172831 A1   6/2019  Chang

\* cited by examiner

METHOD OF FORMING LAYOUT OF SEMICONDUCTOR DEVICE

BACKGROUND OF THE INVENTION

1. Field of the Invention

The present invention relates generally to a method of forming a layout of a semiconductor device, and more specifically to a method of forming a layout of a semiconductor device which changes the layout in boundary areas.

2. Description of the Prior Art

Random access memory (RAM) can be operated to read data from it and write data into it. As computers containing RAM turn off, data disappears from the RAM immediately. Since data in RAM can be altered easily, RAM is widely used as temporary data storage memory in personal computers. RAM can be classified into dynamic-type and static-type.

A static random access memory (SRAM: Static RAM) stores one-bit data by six transistors, and electricity is not needed during operating to keep this data, thus called Static RAM. Static RAM is a complex structure, therefore having high access speed and high cost, thereby it is often used as a memory providing low capacity but high speed such as a cache memory built-in a central processing unit (CPU) of a personal computer.

A dynamic random access memory (DRAM: Dynamic RAM) stores one-bit data by one transistor paired with one capacitor, and electricity must be supported during operating to keep this data, thus called Dynamic RAM. Dynamic RAM is a simple structure, therefore having slow access speed and low cost. Thus, it is often used as a memory providing high capacity but low speed such as a main memory of a personal computer.

SUMMARY OF THE INVENTION

The present invention provides a method of forming a layout of a semiconductor device, which changes extending directions of line patterns in boundary areas to enlarge the distances between transferred patterns, thereby improving the precision of trimming processes.

The present invention provides a method of forming a layout of a semiconductor device including the following steps. A plurality of first line patterns are formed, wherein the first line patterns extend along a first direction in a first area and a second area, but the first line patterns extend along a second direction in a boundary area between the first area and the second area, wherein the second direction is different from the first direction. A plurality of second line patterns are formed, wherein the second line patterns extend along a third direction in the first area and the second area, but the second line patterns extend along a fourth direction in the boundary area between the first area and the second area, wherein the fourth direction is different from the third direction, so that minimum distances between overlapping areas of the first line patterns and the second line patterns in the boundary area are larger than minimum distances between overlapping areas of the first line patterns and the second line patterns in the first area and the second area. A trimming process is performed to shade the first line patterns and the second line patterns in the boundary area and the second area.

According to the above, the present invention provides a method of forming a layout of a semiconductor device, which forms a plurality of first line patterns, wherein the first line patterns extend along a first direction in a first area and a second area, but the first line patterns extend along a second direction in a boundary area between the first area and the second area, wherein the second direction is different from the first direction; forms a plurality of second line patterns, wherein the second line patterns extend along a third direction in the first area and the second area, but the second line patterns extend along a fourth direction in the boundary area between the first area and the second area, wherein the fourth direction is different from the third direction. Therefore, minimum distances between overlapping areas of the first line patterns and the second line patterns in the boundary area are larger than minimum distances between overlapping areas of the first line patterns and the second line patterns in the first area and the second area. Thus, as a trimming process is performed to shade the first line patterns and the second line patterns in the boundary area and the second area, and to transfer the first line patterns and the second line patterns only in the first area into a below material layer, exposed overlapping areas being shaded or shaded overlapping areas being exposed caused by the shifting of edges of a patterned photoresist used in the trimming process can be avoided. This improves the precision of the trimming process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
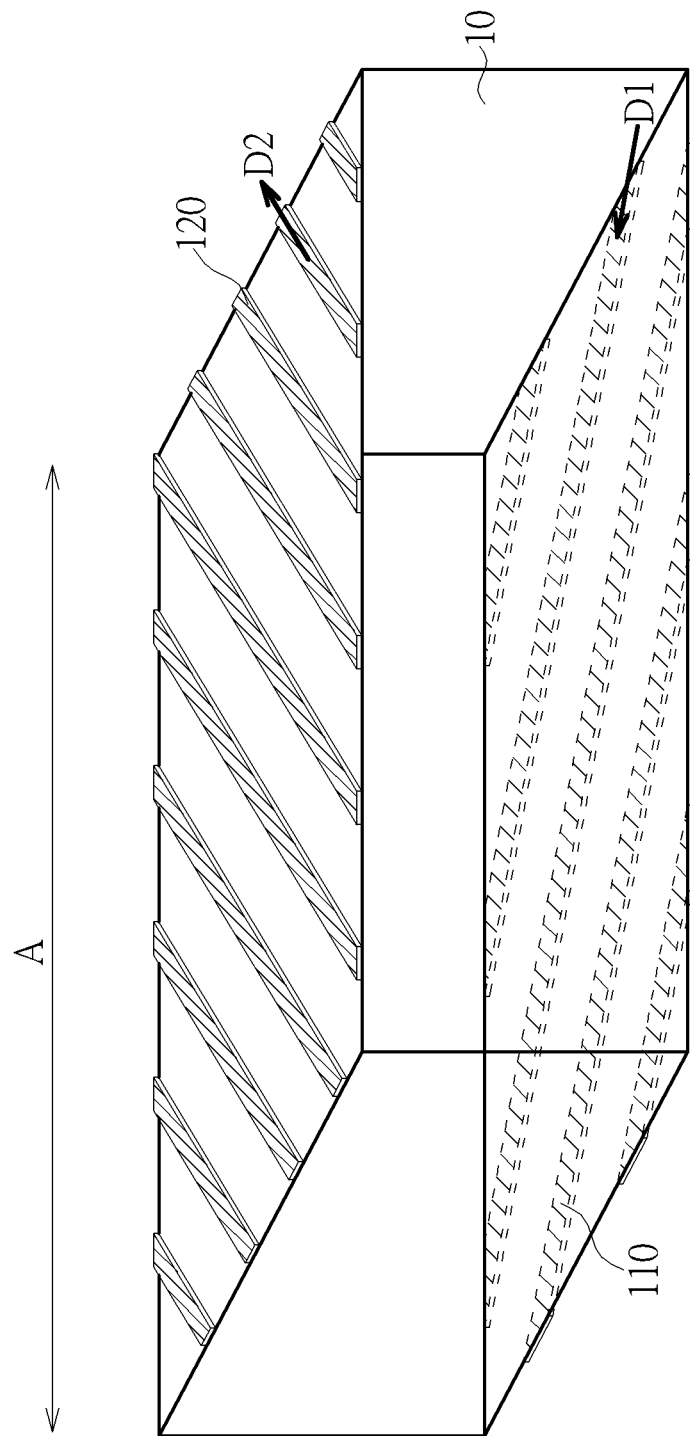
FIG. 1 schematically depicts a three dimensional diagram of line patterns according to an embodiment of the present invention.
Figure 2:
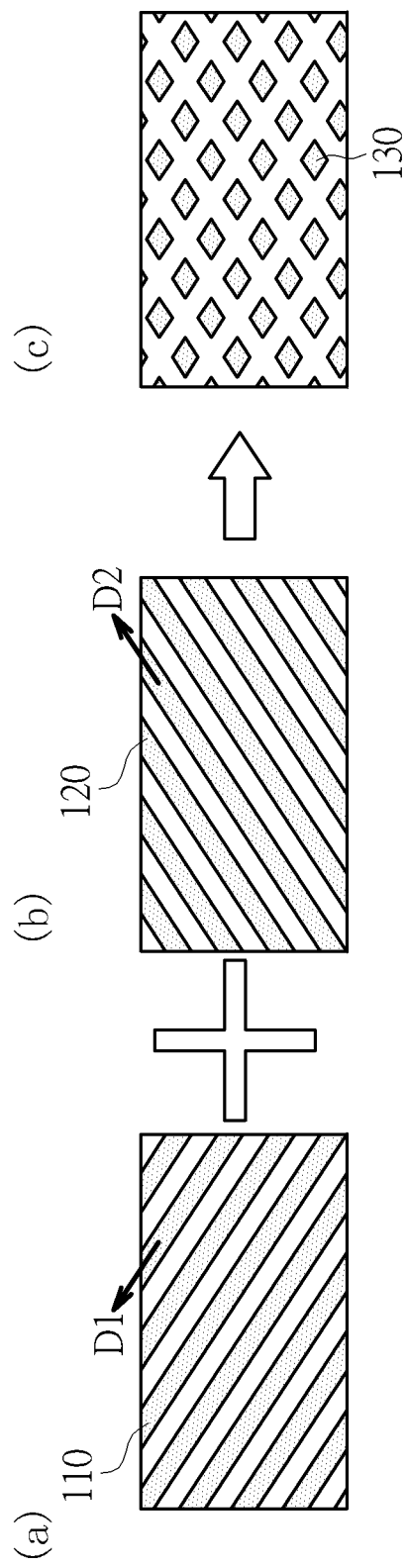
FIG. 2 schematically depicts a top view of line patterns according to an embodiment of the present invention.

FIG. 1 schematically depicts a three dimensional diagram of line patterns according to an embodiment of the present invention. As shown in FIG. 1, a plurality of first line patterns 110 and a plurality of second line patterns 120 are located in different planes, and the first line patterns 110 and the second line patterns 120 are isolated from each other by an insulating layer 10. FIG. 1 only depicts the insulating layer 10 being a single layer, but the insulating layer 10 may be a multilayer in other embodiments. FIG. 1 only depicts a first area A, and the first line patterns 110 extend along a direction D1 in the first area A, and the second line patterns 120 extend along a direction D2 in the first area A. FIG. 2 schematically depicts a top view of the first line patterns 110 and the second line patterns 120. FIG. 2(a) depicts the first line patterns 110 extend along the direction D1, and FIG. 2(b) depicts the second line patterns 120 extend along the direction D2. The direction D1 is different from the direction D2, so that the first line patterns 110 and the second line patterns 120 intersect overlapping areas 130. While applying a self-aligned double pattering (SADP) process to form mask patterns in one case, only the material layer right below the overlapping areas 130 intersected by the first line patterns 110 and the second line patterns 120 can be etched. As shown in FIG. 2(c), the overlapping areas 130 have rhombus shape top views, so that rhombus holes can be formed in the material layer right below the first line patterns 110 and the second line patterns 120. In one embodiment, the rhombus holes may be rounded into circular holes after etching the material layer or a stacked material layer below the material layer several times.

Figure 3:
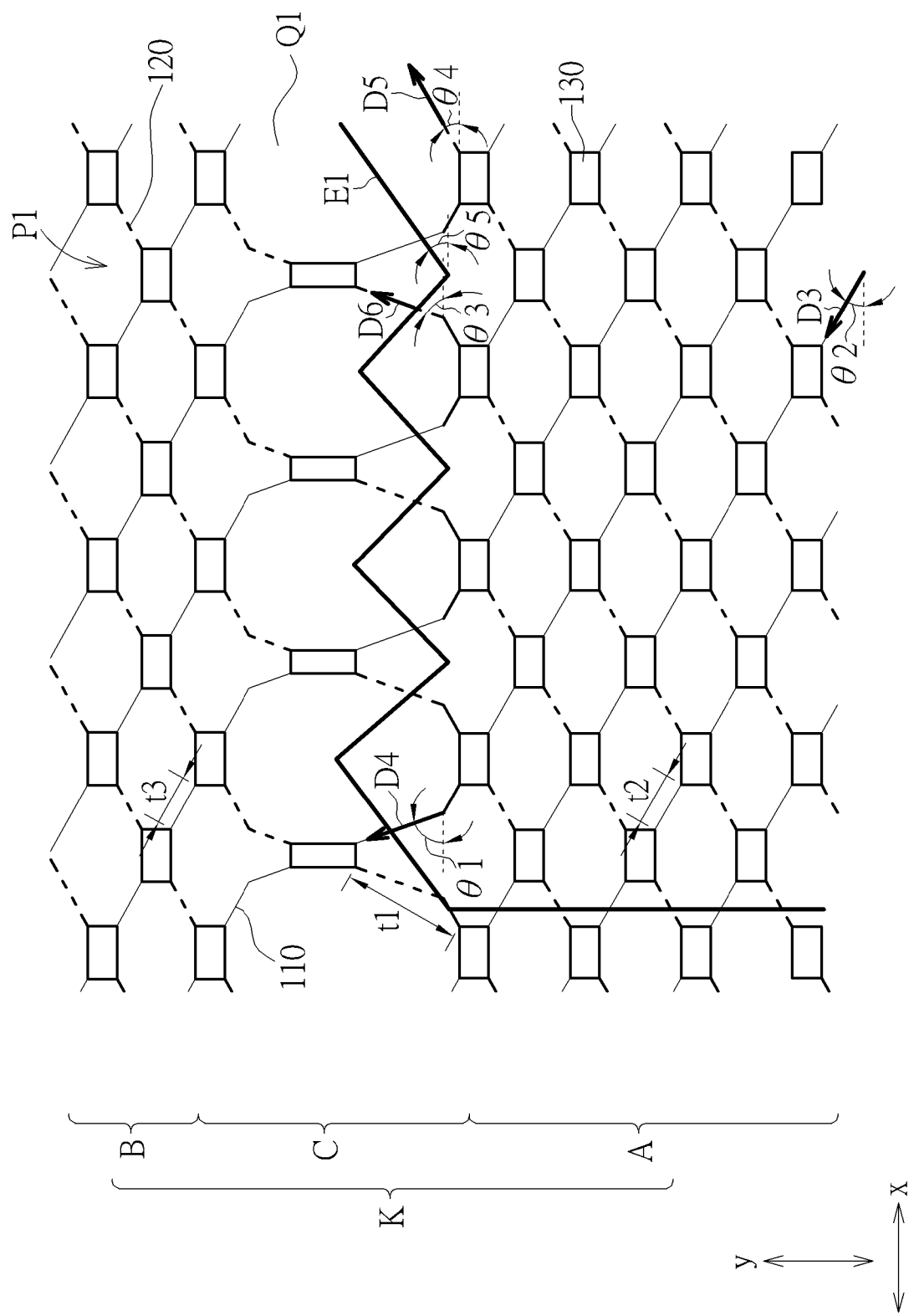
FIG. 3 schematically depicts a top view of a method of forming a layout of a semiconductor device according to an embodiment of the present invention.

The first line patterns 110 and the second line patterns 120 are disposed in many areas, but patterns are only transferred in a specific area. FIG. 3 schematically depicts a top view of a method of forming a layout of a semiconductor device according to an embodiment of the present invention. For clarifying the present invention, the first line patterns 110 and the second line patterns 120 are shown with solid lines and dashed lines respectively, and the overlapping areas 130 intersected by the first line patterns 110 and the second line patterns 120 are depicted as rhombus areas. As shown in FIG. 3, a plurality of first line patterns 110 are formed, wherein the first line patterns 110 extend along a first direction D3 in a first area A and a second area B, but the first line patterns 110 extend along a second direction D4 in a boundary area C between the first area A and the second area B, wherein the second direction D4 is different from the first direction D3. A plurality of second line patterns 120 may then be formed in different layers, wherein the second line patterns 120 extend along a third direction D5 in the first area A and the second area B, but the second line patterns 120 extend along a fourth direction D6 in the boundary area C between the first area A and the second area B, wherein the fourth direction D6 is different from the third direction D5, so that minimum distances t1 between the overlapping areas 130 of the first line patterns 110 and the second line patterns 120 in the boundary area C are larger than minimum distances t2 between the overlapping areas 130 of the first line patterns 110 and the second line patterns 120 in the first area A and minimum distances t3 between the overlapping areas 130 of the first line patterns 110 and the second line patterns 120 in the second area B. Thereafter, a trimming process P1 is performed to shade the first line patterns 110 and the second line patterns 120 in the boundary area C and the second area B. In this embodiment, the trimming process P1 is performed by forming a patterned photoresist Q1 covering the first line patterns 110 and the second line patterns 120 in the boundary area C and the second area B.

Since the first line patterns 110 and the second line patterns 120 extend along directions in the boundary area C different from directions in the first area A and the second area B, the minimum distances t1 between the overlapping areas 130 of the first line patterns 110 and the second line patterns 120 in the boundary area C are larger than the minimum distances t2/t3 between the overlapping areas 130 of the first line patterns 110 and the second line patterns 120 in the first area A and the second area B. Therefore, an edge E1 of the patterned photoresist Q1 in the boundary area C can be positioned precisely without shading the overlapping areas 130.

Since the minimum distances t1 between the overlapping areas 130 of the first line patterns 110 and the second line patterns 120 in the boundary area C are larger than the minimum distances t2/t3 between the overlapping areas 130 of the first line patterns 110 and the second line patterns 120 in the first area A and the second area B, the fineness of the layout in the first area A and the second area B can be maintained while the edge E1 of the patterned photoresist Q1 in the boundary area C can be positioned precisely between the overlapping areas 130, wherein the patterned photoresist Q1 can cover the second area B having no pattern being formed in the material layers right below the second area B, and expose the first area A having patterns being formed in the material layers right below the first area A during later processes. In other words, there are only holes formed in the material layer right below the overlapping areas 130 in the first area A, but it is not limited thereto.

In this embodiment, the first area A is a storage node pattern area, and the second area B is a storage node spare pattern area, thereby the material layer below the first line patterns 110 and the second line patterns 120 may being a hard mask layer of a storage node pattern in a dynamic random access memory area. Thus, a mask pattern can be formed in the material layer exposed by the overlapping areas 130, and then the mask pattern can be transferred into a storage node layer to form a storage node mask, but it is not limited thereto.

In a preferred embodiment, the overlapping areas 130 are distributed along a horizontal direction x and along a vertical direction y, and therefore constitute a plane. A pattern area K is divided into the first area A, the boundary area C and the second area B at the vertical direction y. In this case, an acute angle θ1 between the second direction D4 and the horizontal direction x is larger than an acute angle θ2 between the first direction D3 and the horizontal direction x; an acute angle θ3 between the fourth direction D6 and the horizontal direction x is larger than an acute angle θ4 between the third direction D5 and the horizontal direction x. Therefore, the minimum distances t1 between the overlapping areas 130 of the first line patterns 110 and the second line patterns 120 in the boundary area C are larger than the minimum distances t2 between the overlapping areas 130 of the first line patterns 110 and the second line patterns 120 in the first area A and the minimum distances t3 between the overlapping areas 130 of the first line patterns 110 and the second line patterns 120 in the second area B. In a preferred embodiment, the acute angle θ2 between the first direction D3 and the horizontal direction x is 30°, and the acute angle θ1 between the second direction D4 and the horizontal direction x is larger than 30° but less than 90°; the acute angle θ4 between the third direction D5 and the horizontal direction x is 30°, and the acute angle θ3 between the fourth direction D6 and the horizontal direction x is larger than 30° but less than 90°. Thereby, the overlapping areas 130 can be distributed efficiently with the layout precision and processing yields in edge areas being improved.

In a preferred embodiment, the edge E1 of the patterned photoresist Q1 in the boundary area C is a serrated edge, and the edge E1 approaches the middle line between the overlapping areas 130. Therefore, the edge E1 of the patterned photoresist Q1 shifts to shade or expose the nearby overlapping areas 130 can be avoided, thus pattern errors can being avoided. Preferably, acute angles θ5 between the serrated edge E1 of the patterned photoresist Q1 and the horizontal direction x are larger than the acute angle θ2 between the first direction D3 and the horizontal direction x, and the acute angle θ4 between the third direction D5 and the horizontal direction x, but are less than the acute angle θ1 between the second direction D4 and the horizontal direction x, and the acute angle θ3 between the fourth direction D6 and the horizontal direction x.

The steps of forming the first line patterns 110 and the second line patterns 120, and forming patterns below the first line patterns 110 and the second line patterns 120 applying a self-aligned double pattering (SADP) process can be processed as follows, but it is not limited thereto.

Figure 4:
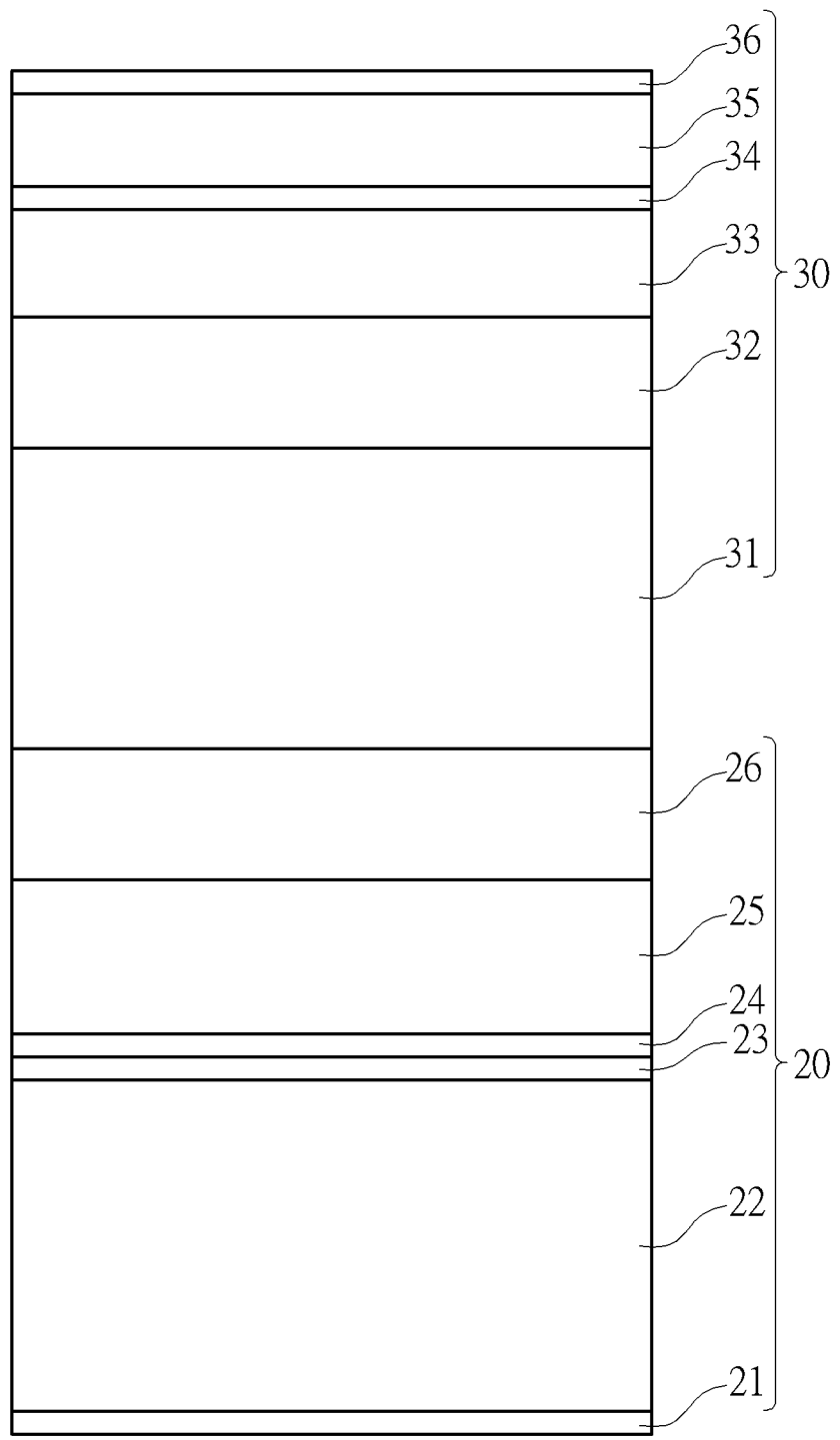
FIG. 4 schematically depicts a cross-sectional view of material layers according to an embodiment of the present invention.

FIG. 4 schematically depicts a cross-sectional view of material layers according to an embodiment of the present invention. In this embodiment, the present invention is applied in patterning a storage node of a capacitor of a dynamic random access memory, and the material layers depicted in FIG. 4 are a hard mask layer used for forming a lower storage node pattern (not shown). As shown in FIG. 4, the material layers below the first line patterns 110 and the second line patterns 120 of FIGS. 1-3 include a nitride layer 21, a borophosphosilicate glass (BPSG) layer 22, an oxide layer 23, a carbon containing nitride layer 24, a plasma enhanced oxide layer 25, a carbon containing nitride layer 26, an amorphous silicon layer 31, an oxide layer 32, an advanced patterning film (APF)33, an oxynitride layer 34, an organic dielectric layer 35 and an oxynitride layer 36 formed by an atomic layer deposition (ALD) process from bottom to top. The thickness of the nitride layer 21 is 210 angstroms, the thickness of the borophosphosilicate glass (BPSG) layer 22 is 8000 angstroms, the thickness of the oxide layer 23 is 500 angstroms, the thickness of the carbon containing nitride layer 24 is 350 angstroms, the thickness of the plasma enhanced oxide layer 25 is 5300 angstroms, the thickness of the carbon containing nitride layer 26 is 2700 angstroms, the thickness of the amorphous silicon layer 31 is 7000 angstroms, the thickness of the oxide layer 32 is 2400 angstroms, the thickness of the advanced patterning film (APF) 33 is 2500 angstroms, the thickness of the oxynitride layer 34 is 400 angstroms, the thickness of the organic dielectric layer 35 is 850 angstroms, and the thickness of the oxynitride layer 36 is 200 angstroms, but it is not limited thereto.

Figure 5A:
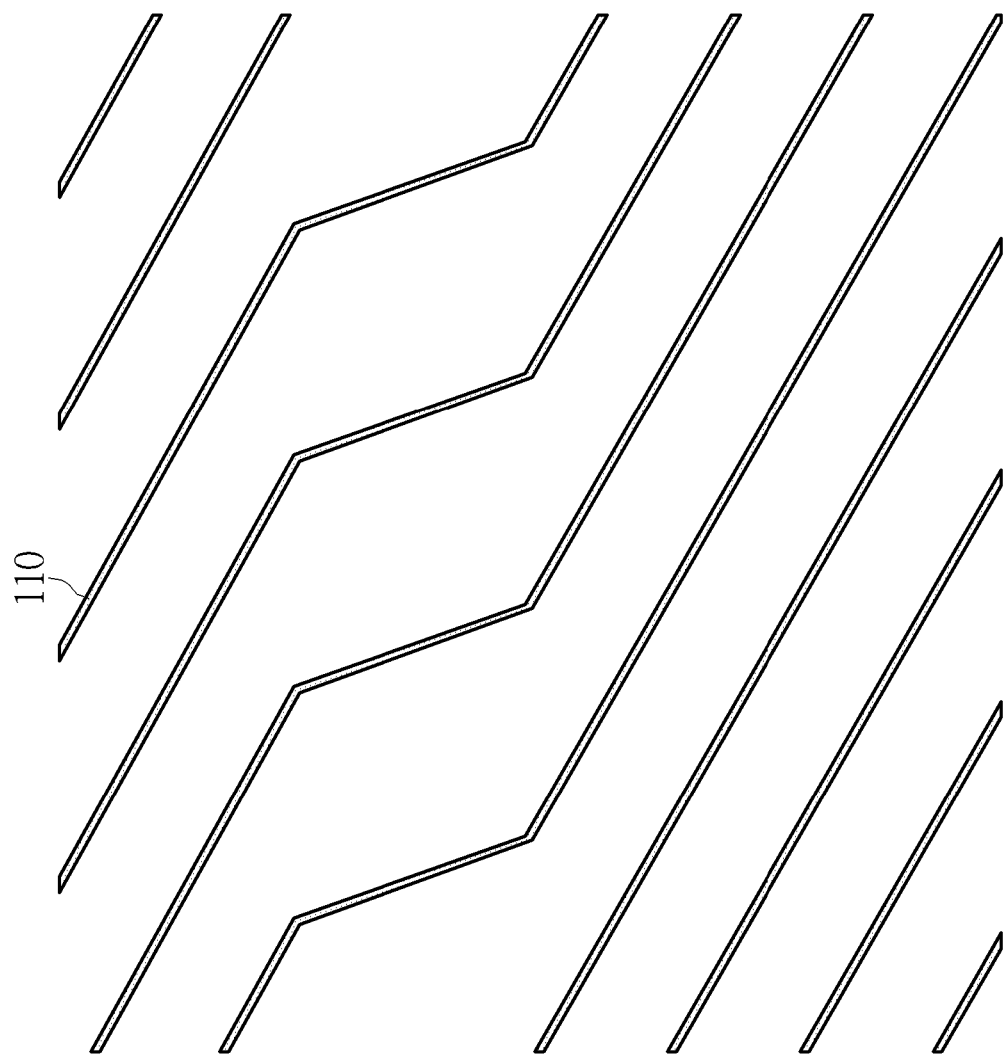
FIG. 5A schematically depicts a top view of line patterns in a pattern transferring process according to an embodiment of the present invention.
Figure 5B:
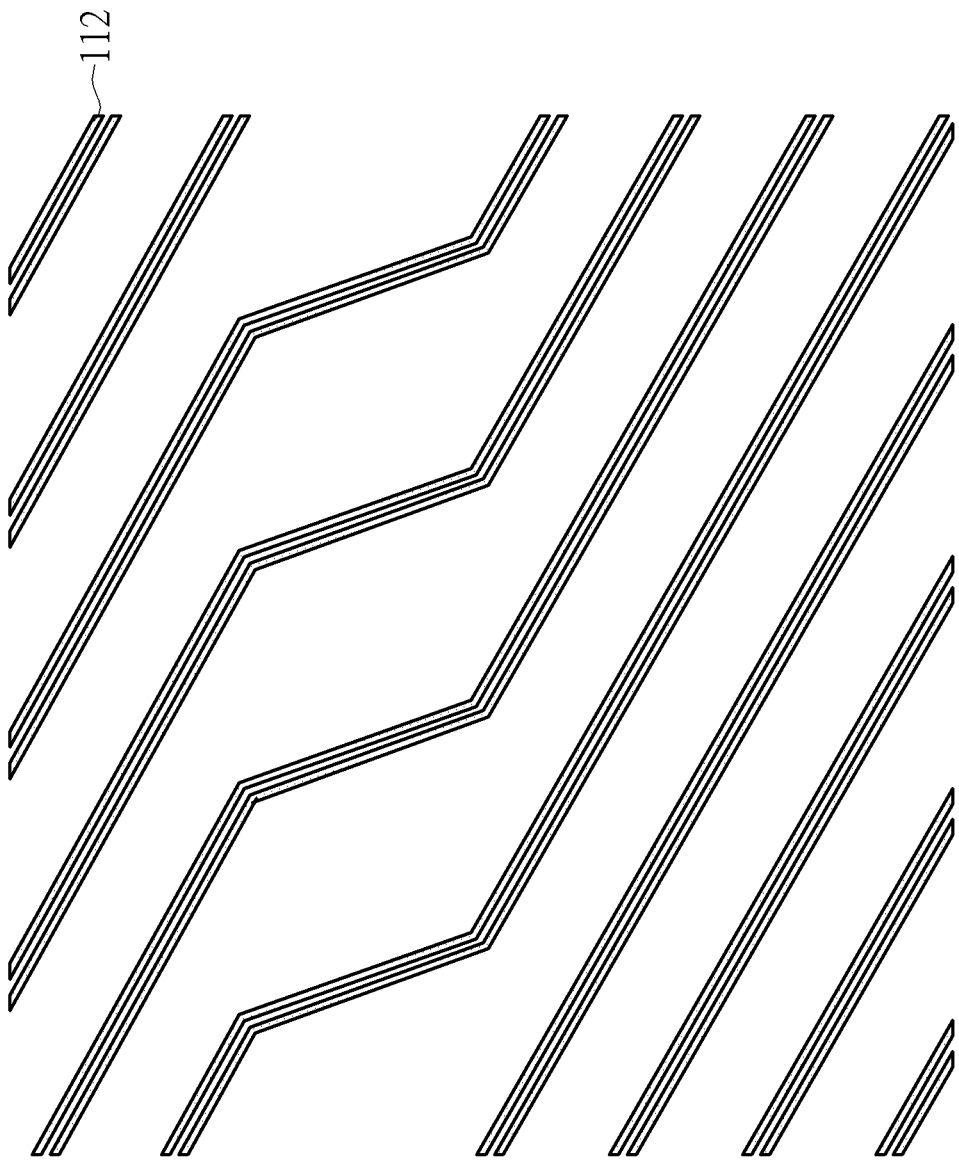
FIG. 5B schematically depicts a top view of line patterns in a pattern transferring process according to an embodiment of the present invention.
Figure 5C:
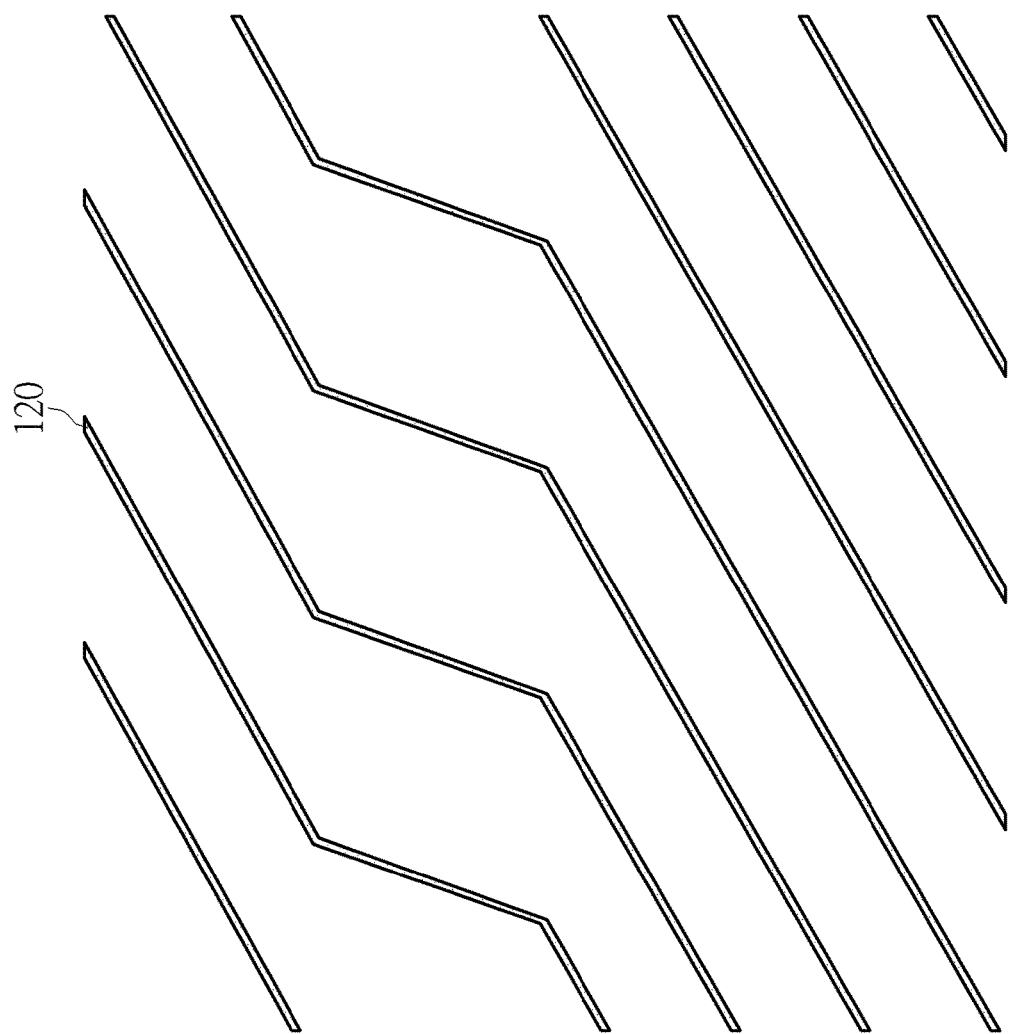
FIG. 5C schematically depicts a top view of line patterns in a pattern transferring process according to an embodiment of the present invention.
Figure 5D:
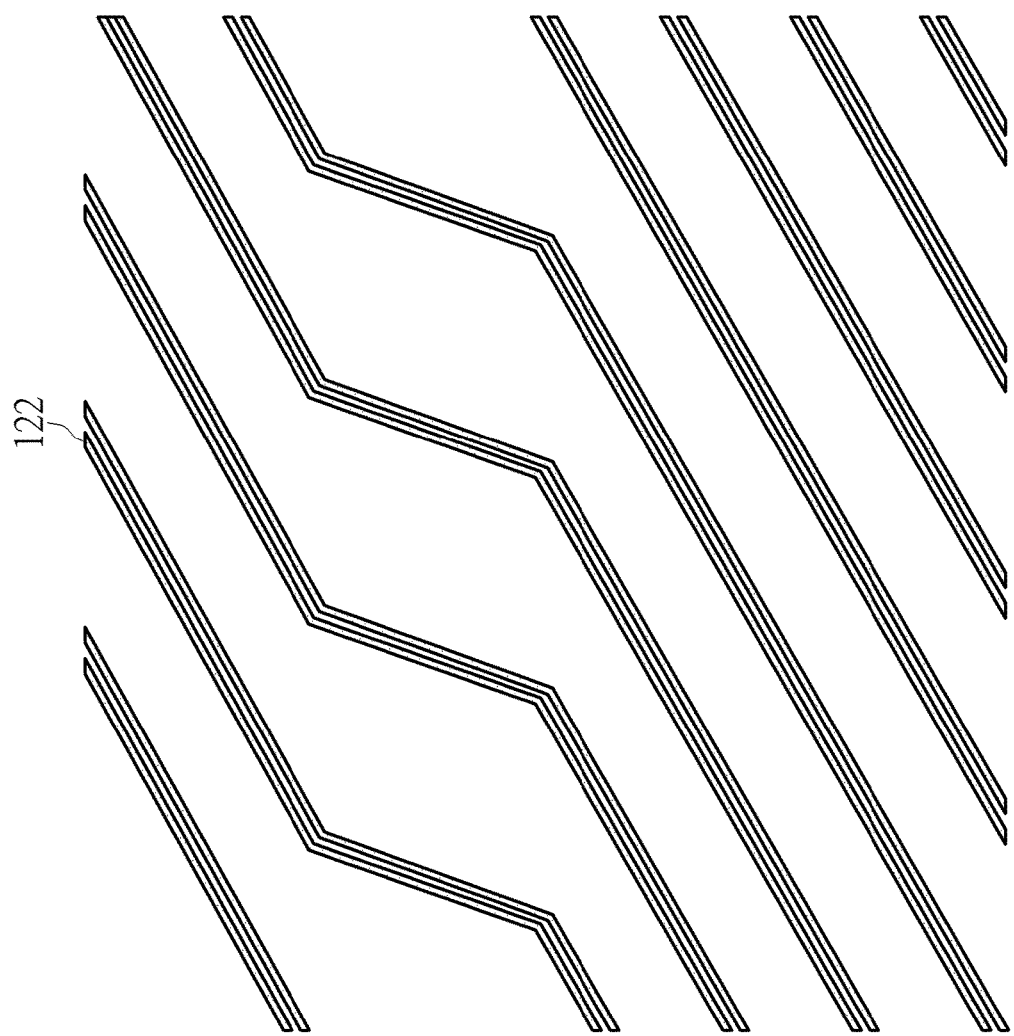
FIG. 5D schematically depicts a top view of line patterns in a pattern transferring process according to an embodiment of the present invention.
Figure 5E:
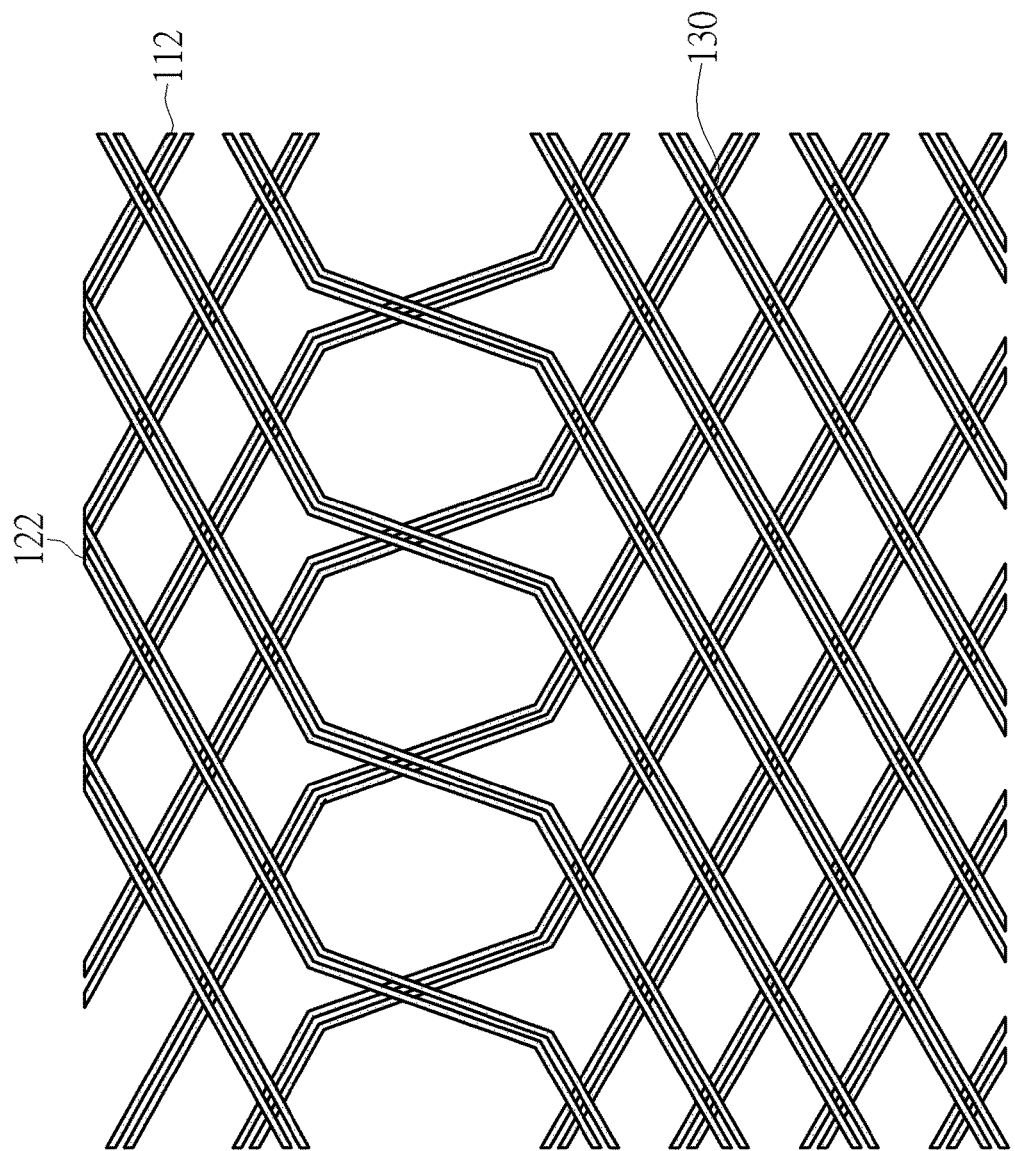
FIG. 5E schematically depicts a top view of line patterns in a pattern transferring process according to an embodiment of the present invention.

In this embodiment, the first line patterns 110 and the second line patterns 120 of FIG. 3 are formed on the material layers 20/30 of FIG. 4, and then the patterns of the first line patterns 110 and the second line patterns 120 are transferred into the material layers 20/30. FIGS. 5A-5E schematically depict top views of line patterns in a pattern transferring process according to an embodiment of the present invention. As shown in FIG. 5A, a plurality of first line patterns 110 of FIG. 3 are formed. Then, as shown in FIG. 5B, a plurality of first spacer patterns 112 surround the first line patterns 110 and then the first line patterns 110 are removed. As shown in FIG. 5C, a plurality of second line patterns 120 of FIG. 3 are formed. As shown in FIG. 5D, a plurality of second spacer patterns 122 surround the second line patterns 120 and then the second line patterns 120 are removed. By doing this, the first spacer patterns 112 and the second spacer patterns 122 formed in different layers and staggered arranged can be formed by the first line patterns 110 and the second line patterns 120, as shown in FIG. 5E. The overlapping areas 130 intersected by the first spacer patterns 112 and the second spacer patterns 122 are holes, wherein the holes are rhombus holes in this embodiment, but it is not limited thereto. After the first spacer patterns 112 and the second spacer patterns 122 are formed, the trimming process P1 of FIG. 3 is performed, so that pattern transferring only occurs in the first area A. That is, the steps of forming the first spacer patterns 112 and the second spacer patterns 122 and removing the first line patterns 110 and the second line patterns 120 are carried out to form rhombus holes in the overlapping areas 130, and then the material layer right below the overlapping areas 130 can be etched, but it is not limited thereto.

Figure 6:
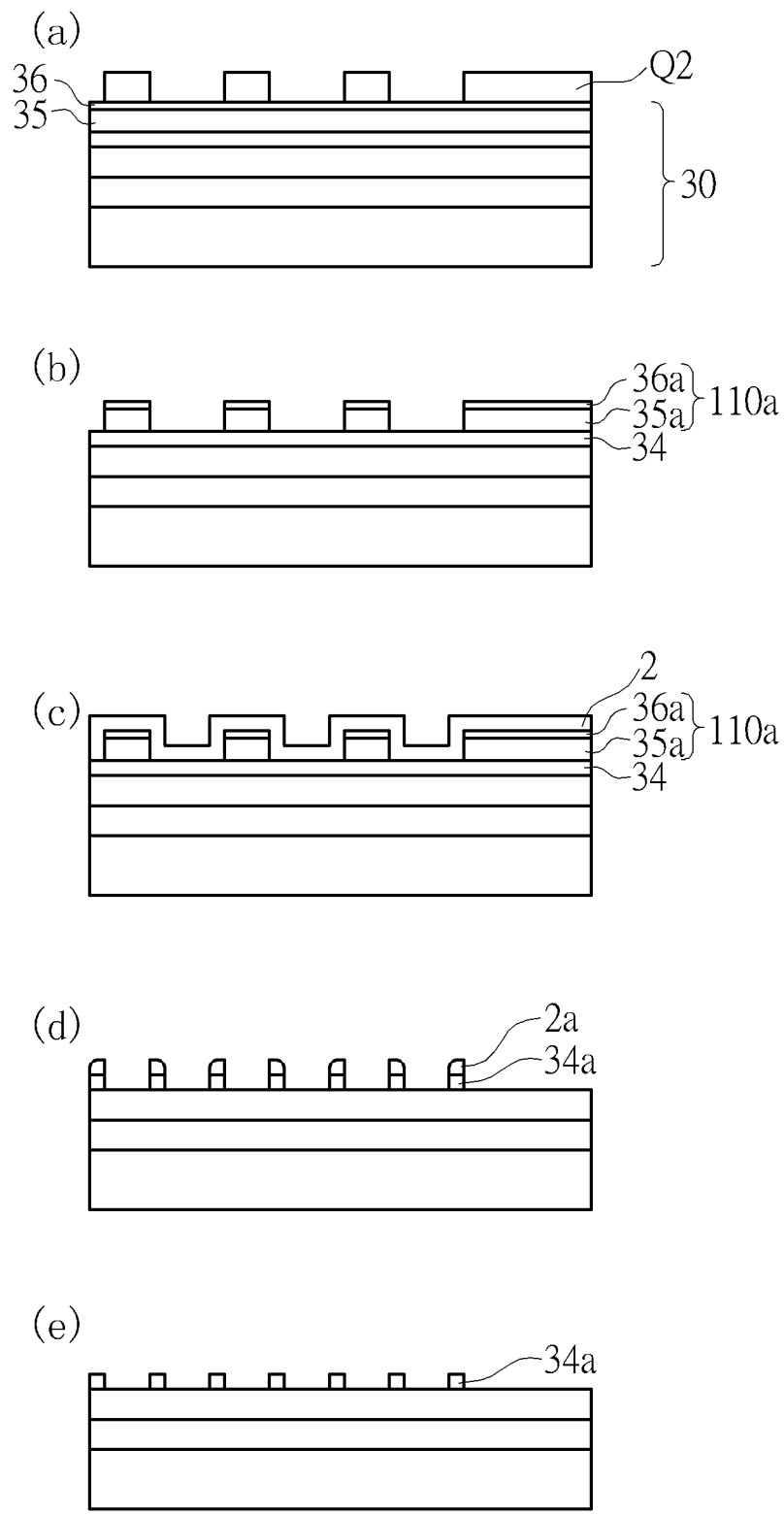
FIG. 6 schematically depicts a cross-sectional view of a pattern transferring process according to an embodiment of the present invention.
Figure 7:
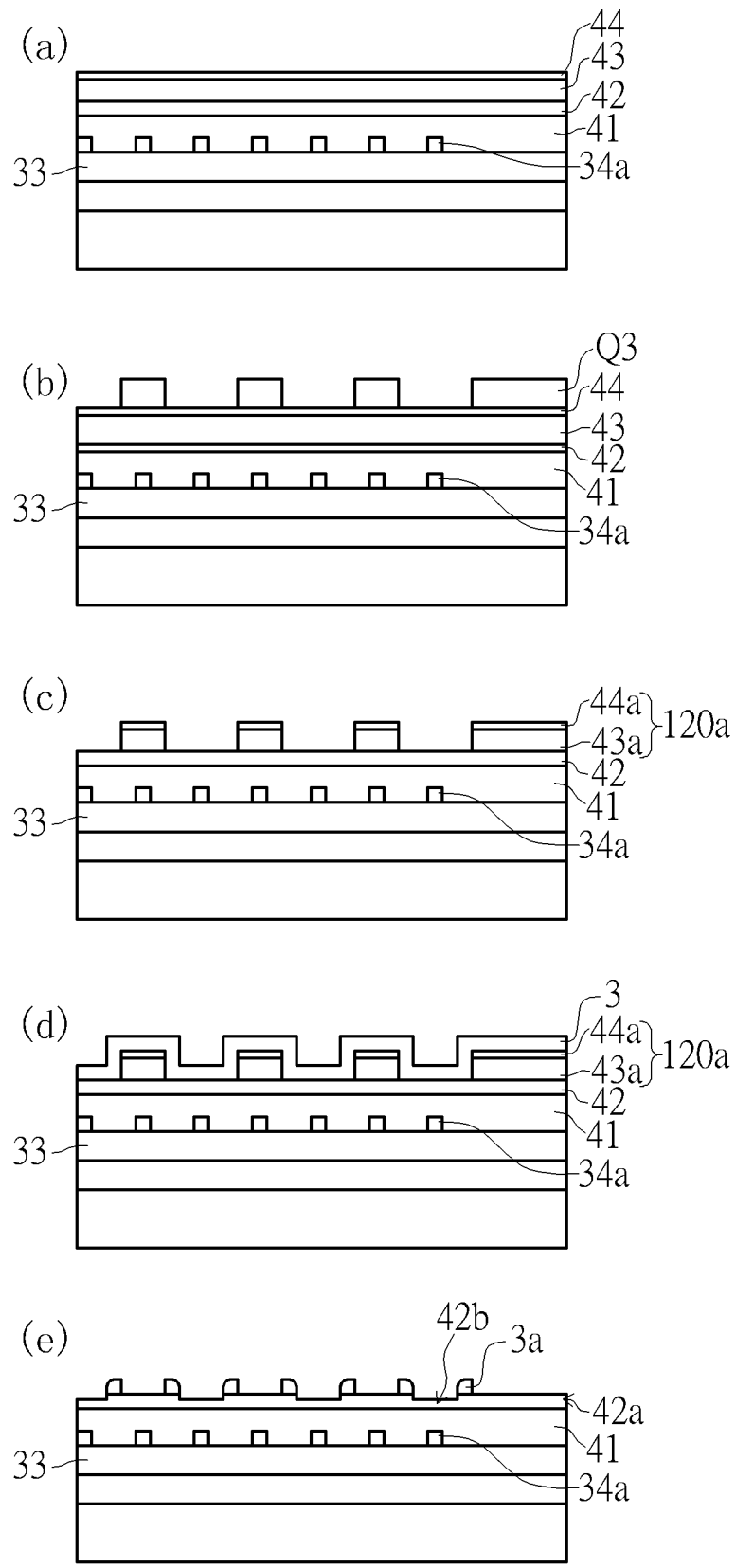
FIG. 7 schematically depicts a cross-sectional view of a pattern transferring process according to an embodiment of the present invention.
Figure 8:
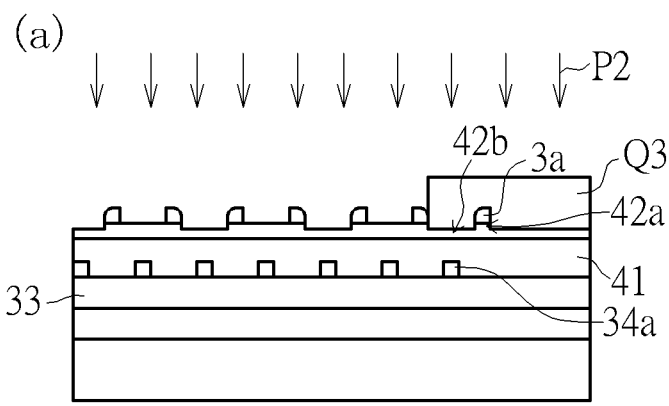
FIG. 8 schematically depicts a cross-sectional view of a pattern transferring process according to an embodiment of the present invention.
Figure 8:
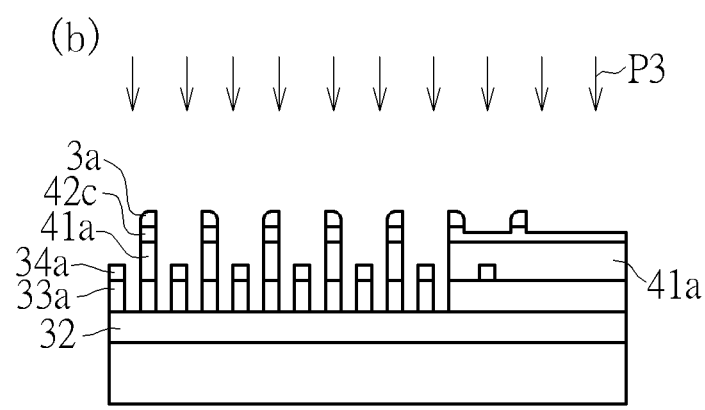
Figure 8:
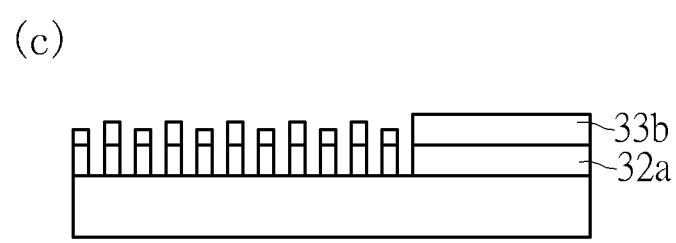
Figure 8:
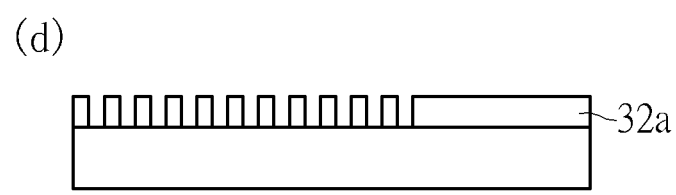

FIGS. 6-8 schematically depict cross-sectional views of a pattern transferring process according to an embodiment of the present invention. Steps of the pattern transferring process in every area are the same, so that only the cross-sectional views of the boundary area C are depicted in FIGS. 6-8. In this case, the material layer 20/30 of FIG. 4 is a hard mask layer, and the hard mask layer is preferably a stacked hard mask layer. In a preferred embodiment, the patterns of the first line patterns 110 and the second line patterns 120 of FIG. 3 are transferred to the material layer 20/30 of FIG. 4 by several processes. For clarifying the present invention, the steps of transferring the patterns of the first line patterns 110 and the second line patterns 120 into the material layer 30 of FIG. 4 are only depicted, and the steps of transferring the patterns of the material layer 30 into the material layer 20 are well known in the art, and are not described herein.

FIG. 6 depicts a method of forming the first line patterns 110 of FIG. 3. As shown in FIG. 6(a), a patterned photoresist Q2 is formed to cover the material layer 30. The oxynitride layer 36 and the organic dielectric layer 35 of the material layer 30 are etched to form a patterned organic dielectric layer 35a and a patterned oxynitride layer 36a on the oxynitride layer 34, as shown in FIG. 6(b). In this embodiment, the patterned organic dielectric layer 35a and the patterned oxynitride layer 36a constitute first line patterns 110a. As shown in FIG. 6(c)-FIG. 6(d), the oxynitride layer 34a (meaning the first spacer patterns) is formed to surround the first line patterns 110a, and then the first line patterns 110a are removed. More precisely, as shown in FIG. 6(c), a spacer material 2 blanketly covers the patterned organic dielectric layer 35a and the patterned oxynitride layer 36a (meaning the first line patterns 110a); then, the spacer material 2 is etched to form spacers 2a and the oxynitride layer 34a surrounding the first line patterns 110a, and then the first line patterns 110a are removed, as shown in FIG. 6(d). Thereafter, the spacers 2a are removed and the oxynitride layer 34a is reserved, as shown in FIG. 6(e).

FIG. 7 depicts a method of forming the second line patterns 120 of FIG. 3. As shown in FIG. 7(a), an organic dielectric layer 41, an oxynitride layer 42, an organic dielectric layer 43 and an oxynitride layer 44 are formed sequentially to blanketly cover the oxynitride layer 34a and the advanced patterning film (APF) 33. As shown in FIG. 7(b), a patterned photoresist Q3 is formed to cover the oxynitride layer 44. Then, the oxynitride layer 44 and the organic dielectric layer 43 are etched to form a patterned organic dielectric layer 43a and a patterned oxynitride layer 44a on the oxynitride layer 42, as shown in FIG. 7(c). In this embodiment, the patterned organic dielectric layer 43a and the patterned oxynitride layer 44a constitute second line patterns 120a. As shown in FIG. 7(d)-FIG. 7(e), an oxynitride layer 42a and spacers 3a (meaning the second spacer patterns) are formed to surround the second line patterns 120a, and then the second line patterns 120a are removed. More precisely, as shown in FIG. 7(d), a spacer material 3 blanketly covers the patterned organic dielectric layer 43a and the patterned oxynitride layer 44a (meaning the second line patterns 120a); the spacer material 3 is etched to form the oxynitride layer 42a and the spacers 3a surrounding the second line patterns 120a, and then the second line patterns 120a are removed, as shown in FIG. 7(e). In this embodiment, as the spacer material 3 is etched, a part of the oxynitride layer 42 is also etched to form the oxynitride layer 42a, and an oxynitride layer 42b is reserved.

FIG. 8 depicts a method of performing the trimming process P1 of FIG. 3. As shown in FIG. 8, a trimming process P2 is performed, wherein the trimming process P2 is performed by forming a patterned photoresist Q3 covering a part of the oxynitride layer 34a, the oxynitride layer 42a and the spacers 3a. An etching process P3 is performed to etch the oxynitride layer 42b, the organic dielectric layer 41 and the advanced patterning film (APF) 33 exposed by the patterned photoresist Q3, the oxynitride layer 34a, the oxynitride layer 42a and the spacers 3a. Thereby, an advanced patterning film (APF) 33a, an organic dielectric layer 41a and an oxynitride layer 42c are formed from bottom to top. Thereafter, the patterned photoresist Q3 is removed, as shown in FIG. 8(b).

Then, the advanced patterning film (APF) 33a and the oxide layer 32 being exposed are etched to form an advanced patterning film (APF) 33b and an oxide layer 32a with the spacers 3a, the oxynitride layer 42c, the organic dielectric layer 41a and the oxynitride layer 34a being removed completely, as shown in FIG. 8(c). Thereafter, the advanced patterning film (APF) 33b is removed and the oxide layer 32a is exposed, as shown in FIG. 8(d). In this way, desired patterns can be formed precisely in the boundary area by applying the method of the present invention.

To summarize, the present invention provides a method of forming a layout of a semiconductor device, which forms a plurality of first line patterns, wherein the first line patterns extend along a first direction in a first area and a second area, but the first line patterns extend along a second direction in a boundary area between the first area and the second area, wherein the second direction is different from the first direction; forms a plurality of second line patterns, wherein the second line patterns extend along a third direction in the first area and the second area, but the second line patterns extend along a fourth direction in the boundary area between the first area and the second area, wherein the fourth direction is different from the third direction. Therefore, minimum distances between overlapping areas of the first line patterns and the second line patterns in the boundary area are larger than minimum distances between overlapping areas of the first line patterns and the second line patterns in the first area and the second area. Thus, as a trimming process is performed to shade the first line patterns and the second line patterns in the boundary area and the second area, and to transfer the first line patterns and the second line patterns only in the first area into a below material layer, exposed overlapping areas being shaded or shaded overlapping areas being exposed caused by the shifting of edges of a patterned photoresist used in the trimming process can be avoided. This improves the precision of the trimming process.

The patterned photoresist used during the trimming process may have a serrated edge. Preferably, acute angles between the serrated edge of the patterned photoresist and a horizontal direction are larger than an acute angle between the first direction and the horizontal direction, and an acute angle between the third direction and the horizontal direction, but are less than an acute angle between the second direction and the horizontal direction, and an acute angle between the fourth direction and the horizontal direction. This prevents the edge of the patterned photoresist from shifting to overlapping the overlapping areas.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a layout of a semiconductor device, comprising:
   forming a plurality of first line patterns being long straight lines in each areas, wherein the first line patterns extend along a first direction in a first area and a second area, but the first line patterns extend along a second direction in a boundary area between the first area and the second area, wherein the second direction is different from the first direction;
   forming a plurality of second line patterns being long straight lines in each areas, wherein the second line patterns extend along a third direction in the first area and the second area, but the second line patterns extend along a fourth direction in the boundary area between the first area and the second area, wherein the fourth direction is different from the third direction, so that minimum distances between overlapping areas of the first line patterns and the second line patterns in the boundary area are larger than minimum distances between overlapping areas of the first line patterns and the second line patterns in the first area and the second area; and
   performing a trimming process to shade the first line patterns and the second line patterns in the boundary area and the second area.

2. The method of forming a layout of a semiconductor device according to claim 1, wherein the overlapping areas are distributed along a horizontal direction and along a vertical direction, and a pattern area is divided into the first area, the boundary area and the second area at the vertical direction.

3. The method of forming a layout of a semiconductor device according to claim 2, wherein an acute angle between the second direction and the horizontal direction is larger than an acute angle between the first direction and the horizontal direction.

4. The method of forming a layout of a semiconductor device according to claim 3, wherein the acute angle between the first direction and the horizontal direction is 30°, and the acute angle between the second direction and the horizontal direction is larger than 30° but less than 90°.

5. The method of forming a layout of a semiconductor device according to claim 2, wherein an acute angle between the fourth direction and the horizontal direction is larger than an acute angle between the third direction and the horizontal direction.

6. The method of forming a layout of a semiconductor device according to claim 5, wherein the acute angle between the third direction and the horizontal direction is 30°, and the acute angle between the fourth direction and the horizontal direction is larger than 30° but less than 90°.

7. The method of forming a layout of a semiconductor device according to claim 1, wherein the trimming process is performed by forming a patterned photoresist to cover the first line patterns and the second line patterns in the boundary area and the second area.

8. The method of forming a layout of a semiconductor device according to claim 7, wherein an edge of the patterned photoresist in the boundary area is a serrated edge.

9. The method of forming a layout of a semiconductor device according to claim 8, wherein acute angles between the serrated edge of the patterned photoresist and the horizontal direction are larger than an acute angle between the first direction and the horizontal direction, and larger than an acute angle between the third direction and the horizontal direction, but are less than an acute angle between the second direction and the horizontal direction, and less than an acute angle between the fourth direction and the horizontal direction.

10. The method of forming a layout of a semiconductor device according to claim 1, further comprising:
forming a plurality of first spacer patterns surrounding the first line patterns after the first line patterns are formed, and then removing the first line patterns.

11. The method of forming a layout of a semiconductor device according to claim 10, further comprising:
forming a plurality of second spacer patterns surrounding the second line patterns after the second line patterns are formed, and then removing the second line patterns.

12. The method of forming a layout of a semiconductor device according to claim 11, wherein the trimming process is performed after the first spacer patterns and the second spacer patterns are formed.

13. The method of forming a layout of a semiconductor device according to claim 12, wherein the overlapping areas comprise holes enclosed by the first spacer patterns and the second spacer patterns.

14. The method of forming a layout of a semiconductor device according to claim 13, wherein the holes comprise rhombus holes.

15. The method of forming a layout of a semiconductor device according to claim 11, wherein the first spacer patterns and the second spacer patterns are in different layers.

16. The method of forming a layout of a semiconductor device according to claim 12, wherein the first spacer patterns and the second spacer patterns are on a hard mask layer.

17. The method of forming a layout of a semiconductor device according to claim 16, further comprising:
etching the hard mask layer exposed by the overlapping areas to form a mask pattern, and then transferring the mask pattern into a storage node layer to form a storage node pattern.

18. The method of forming a layout of a semiconductor device according to claim 17, wherein the hard mask layer comprises a hard mask layer of a storage node layer in a dynamic random access memory area.

19. The method of forming a layout of a semiconductor device according to claim 18, wherein the first area comprises a storage node pattern area while the second area comprises a storage node spare pattern area.

20. The method of forming a layout of a semiconductor device according to claim 16, wherein the hard mask layer comprises a stacked hard mask layer.

* * * * *